(12) United States Patent
Miura

(10) Patent No.: US 7,050,151 B2
(45) Date of Patent: May 23, 2006

(54) EXPOSURE APPARATUS, EXPOSURE METHOD, AND DEVICE MANUFACTURING METHOD

(75) Inventor: Seiya Miura, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 120 days.

(21) Appl. No.: 10/798,817

(22) Filed: Mar. 10, 2004

(65) Prior Publication Data

US 2004/0179180 A1  Sep. 16, 2004

(30) Foreign Application Priority Data

Mar. 14, 2003  (JP) .............................. 2003-070196

(51) Int. Cl.
*G03B 27/42* (2006.01)
*G03B 27/52* (2006.01)
*G03B 27/32* (2006.01)

(52) U.S. Cl. .............................. 355/53; 355/55; 355/77

(58) Field of Classification Search ................... 355/53, 355/55, 77; 356/399, 400, 401; 250/548
See application file for complete search history.

(56) References Cited

U.S. PATENT DOCUMENTS 5,448,332 A   9/1995 Sakakibara et al.
5,750,294 A   5/1998 Hasegawa et al.
6,476,904 B1 * 11/2002 Kubo .......................... 355/55
2003/0193655 A1 * 10/2003 Ina .............................. 355/55

FOREIGN PATENT DOCUMENTS

| JP | 6-260391 | 9/1994 |
| JP | 6-283403 | 10/1994 |
| JP | 9-45609 | 2/1997 |
| JP | 2003-70196 | 3/2003 |

\* cited by examiner

*Primary Examiner*—Peter B. Kim
(74) *Attorney, Agent, or Firm*—Morgan & Finnegan, LLP

(57) ABSTRACT

To provide an exposure apparatus with which a wafer surface to be exposed can be aligned with a best imaging plane with respect to a reduced focal depth and a high resolution can be attained. The exposure apparatus for exposing a pattern formed on a reticle to an object to be exposed includes: a detecting unit for measuring a position of the object to be exposed at a plurality of first measurement positions that meet a predetermined relative positional relationship in an exposure region of the object to be exposed to which the pattern is exposed and for measuring a position of the object to be exposed at a plurality of second measurement positions that meet the predetermined relative positional relationship in regions outside the exposure region; and a control unit for controlling at least one of a position, a height, and a tilt of the object to be exposed based on information on the position of the object to be exposed which is measured by the detecting unit.

21 Claims, 11 Drawing Sheets

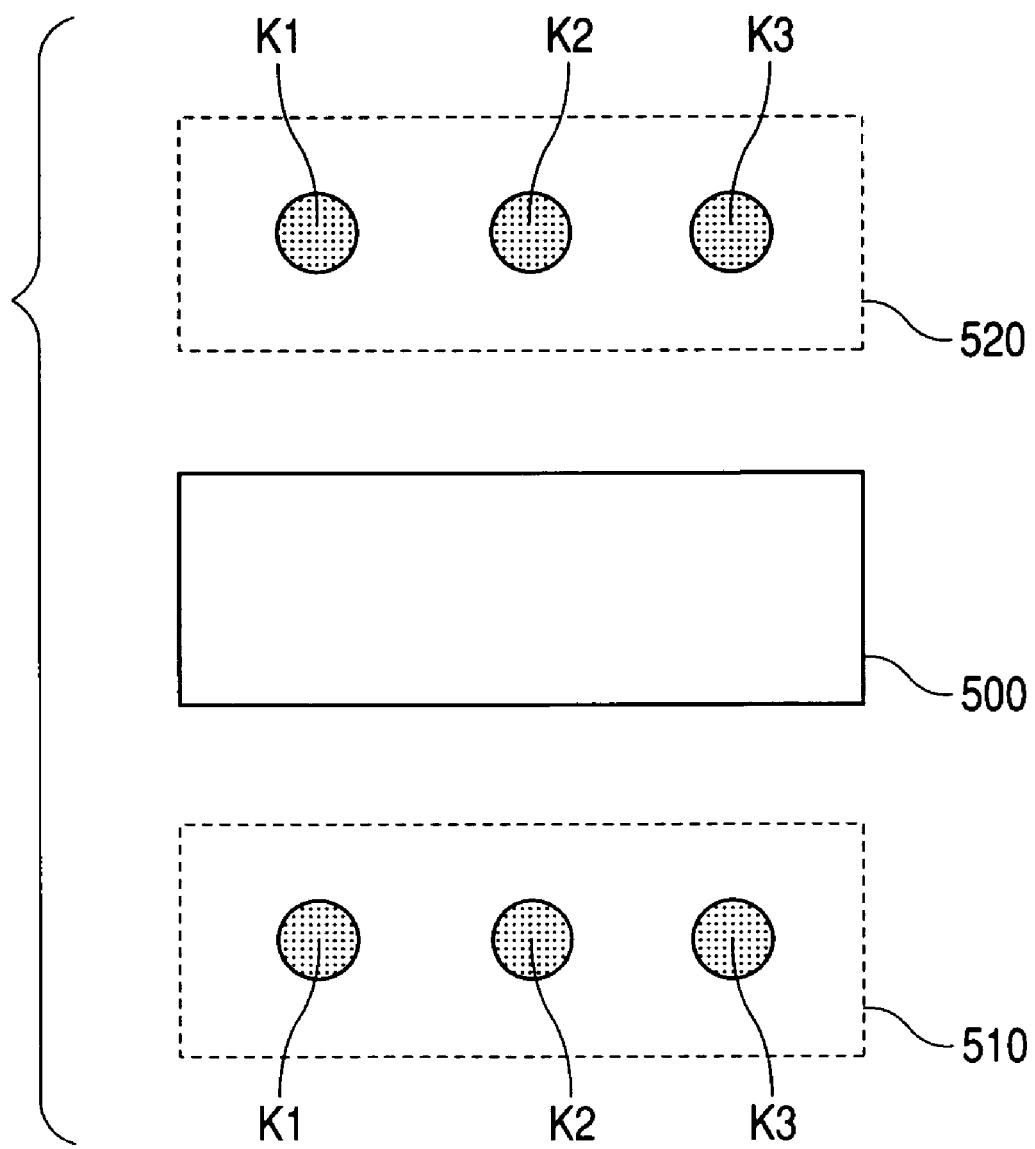

EXPOSURE APPARATUS, EXPOSURE METHOD, AND DEVICE MANUFACTURING METHOD

BACKGROUND OF THE INVENTION

1. Field of the Invention

The present invention generally relates to an exposure apparatus and an exposure method. In particular, the present invention relates to an exposure apparatus and an exposure method for performing projection and exposure on an object to be exposed such as a single crystal substrate for a semiconductor wafer or a glass substrate for a liquid crystal display (LCD).

2. Related Background Art

Up to now, in manufacturing a device (e.g., a semiconductor device, a liquid crystal display device, or a thin film magnetic head) using a photolithographic technique, a projection exposure apparatus has been adopted. The projection exposure apparatus projects and transfers a circuit pattern drawn on a mask or a reticle (in this application, the two terms are used interchangeably) onto a wafer etc., by using a projection optical system.

As regards the projection exposure apparatus, there is an increasing demand for projection and exposure of the circuit pattern on the reticle to the wafer with a higher resolving power as may keep up with recent miniaturization and high integration scale of an integrated circuit. The smallest possible size (resolution) of the pattern which the projection exposure apparatus transfers is proportional to a wavelength of light used for the exposure but inversely proportional to numerical aperture (NA) of the projection optical system. Accordingly, the shorter the wavelength, the higher the resolution. Thus, in recent years, as the light source, an ultrahigh-pressure mercury lamp (g-line (wavelength: about 436 nm) or i-line (wavelength: about 365 nm)) is replaced by a KrF excimer laser (wavelength: about 248 nm) or an ArF excimer laser (wavelength: about 193 nm) which has a shorter wavelength. Further, an F2 laser (wavelength: about 157 nm) is being put into practical use. In addition, a demand to further enlarge an exposure region is growing.

To meet such demands, a step-and-scan system exposure apparatus (also called a "scanner") is gaining popularity over a step-and-repeat system exposure apparatus (also called a "stepper"). The stepper collectively exposes a substantially square exposure region on a wafer after the reduction, whereas the scanner relatively scans the reticle and the wafer at a high speed with the exposure region formed in a rectangular slit-shape to thereby expose a large-area screen with accuracy.

The scanner effects correction such as alignment of a wafer surface with an optimum exposure position upon exposing a predetermined position of the wafer by measuring a surface position of the wafer at the predetermined position by surface position detection means of an oblique optical system before the predetermined position of the wafer comes in an exposure slit region during the exposure. Thus, it is possible to suppress an influence of a levelness of the wafer.

As shown in FIG. 16, in particular, plural measurement points (K1 to K3) are arranged on each of a preceding region 510 and a succeeding region 520 of an exposure slit region 500 in a longitudinal direction (i.e., a direction orthogonal to a scanning direction) of the exposure slit with an intention to measure a tilt as well as a height (focus) of the surface position of the wafer. Here, exposure scanning light is moved from both the preceding region and the succeeding region. Therefore, the measurement points are arranged in the preceding region and the succeeding region of the exposure slit region so that the focus and the tilt of the wafer can be measured prior to the exposure. Various methods of measuring the focus and the tilt have been proposed (see Japanese Patent Application Laid-Open No. H09-45609 (counterpart: U.S. Pat. No. 5,750,294 B), for example). FIG. 16 is a schematic diagram showing an example of arrangement of the measurement points K1 to K3 relative to the exposure region 500 in a conventional case.

Further, proposed as a method of measuring and correcting a surface position of a wafer in a scanner is a method of arranging plural measurement points in a previously scanning region outside the exposure region and measuring a focus and a tilt in a scanning direction and a non-scanning direction (see Japanese Patent Application Laid-Open No. H06-260391 (counterpart: U.S. Pat. No. 5,448,332 B), for example). Also proposed is a method of arranging plural measurement points in the exposure region, obtaining measurement information on a focus and a tilt in a scanning direction and a non-scanning direction, and correcting by moving the wafer (see Japanese Patent Application Laid-Open No. H06-283403 (counterpart: U.S. Pat. No. 5,448,332 B), for example).

In recent years, a wavelength of the exposure light has been more and more shortened and NA of the projection optical system has further increased, leading to an extremely smaller focal depth. A much higher precision, i.e., focus precision is being needed for aligning the wafer surface to be exposed with a best imaging plane.

In particular, there are growing needs for the precise measurement on the tilt of the wafer surface in the scanning direction (transverse direction of the exposure region) and the accurate correction of the tilt. The need for the enhancement of a property of following the focus in the exposure area of the wafer that has too rough (uneven) surface is also growing.

However, even if the surface position of the wafer is measured in the exposure region and corrected by moving the wafer, there is a defect in that on account of being subjected to scanning exposure, the wafer is corrected and moved too late for alignment of the wafer surface to be exposed with the best imaging plane.

Also, a method of arranging plural measurement points in a scanning direction and a non-scanning direction in the exposure region and obtaining information on tilt of the wafer in the scanning direction based on chronological information obtained through scanning of the wafer encounters a problem that measurements includes an asynchronous error to lower measurement precision, for example, making it impossible to align the wafer surface to be exposed with the best imaging plane.

SUMMARY OF THE INVENTION

In view of the above problems, the present invention has an exemplary object to provide an exposure apparatus and an exposure method, and a device manufacturing method, with which a wafer surface to be exposed can be aligned with a best imaging plane with respect to a reduced focal depth and a high resolution can be attained.

In order to attain the above-mentioned object, according to one aspect of the present invention, an exposure apparatus for exposing a pattern formed on a reticle to an object to be exposed includes:

detecting means for measuring a position of the object to be exposed at a plurality of first measurement positions that meet a predetermined relative positional relationship in an exposure region of the object to be exposed to which the pattern is exposed and for measuring a position of the object to be exposed at a plurality of second measurement positions that meet the predetermined relative positional relationship in regions outside the exposure region; and control means for controlling at least one of a position, a height, and a tilt of the object to be exposed based on information on the position of the object to be exposed which is measured by the detecting means.

Other objects and features of the present invention will be apparent upon reading the following explanation of preferred embodiments with reference to the accompanying drawings.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 16 is a schematic diagram showing an example of arrangement of measurement points relative to an exposure region in a conventional case.

DESCRIPTION OF THE PREFERRED EMBODIMENTS

Figure 1:
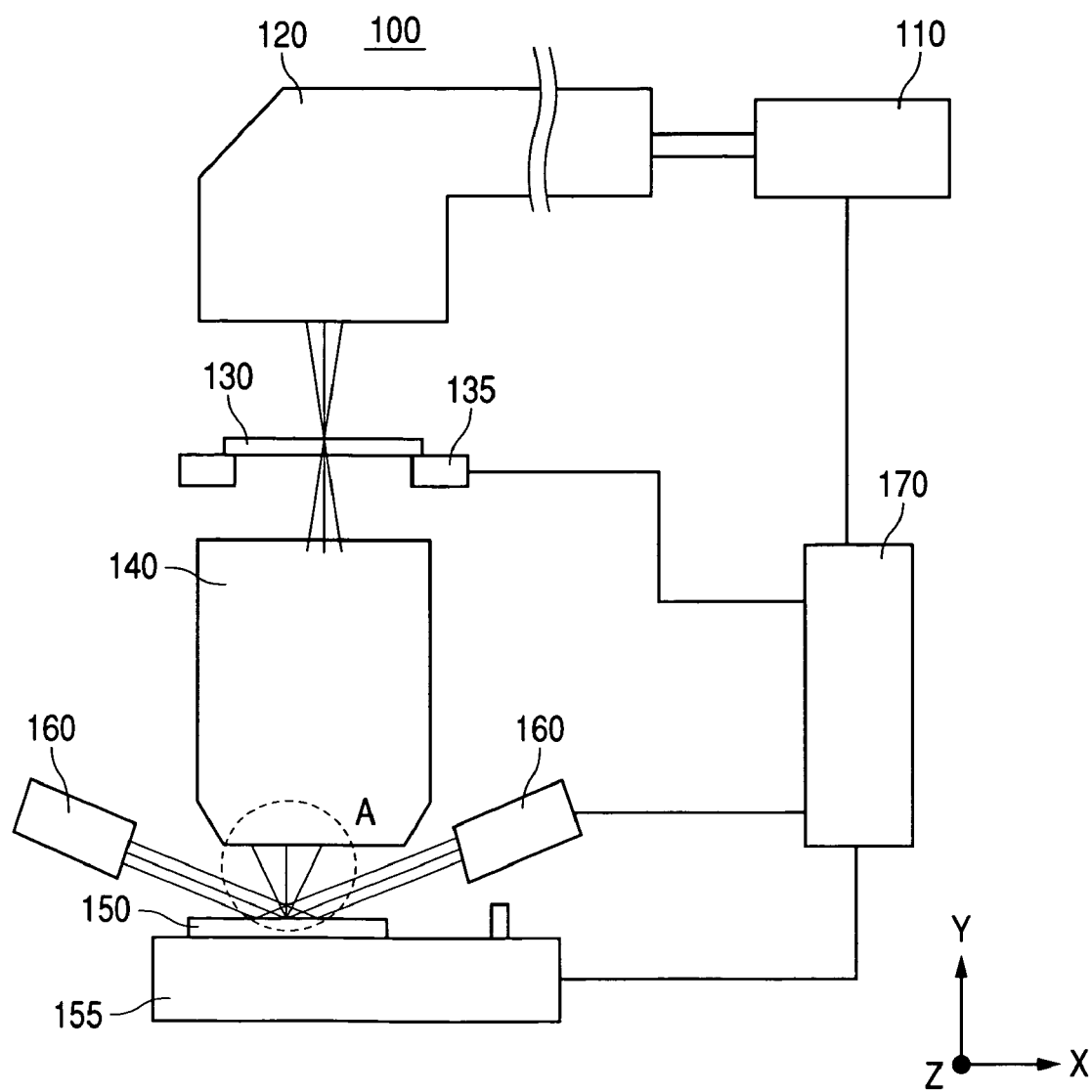
FIG. 1 is a schematic structural diagram showing an exemplary form of an exposure apparatus according to an aspect of the present invention.

Hereinafter, an exposure apparatus according to an embodiment of the present invention will be described in detail with reference to the accompanying drawings. However, the present invention is not limited to the embodiment but allows any alternative replacement of structural members within a range where an object of the present invention is attained. FIG. 1 is a schematic structural diagram showing an exemplary form of an exposure apparatus 100 according to an aspect of the present invention.

As shown in FIG. 1, the exposure apparatus 100 includes: a light source 110; an illumination optical system 120; a reticle stage 135 for holding a reticle 130; a projection optical system 140; a wafer stage 155 for holding a wafer 150; a detection system 160; and a control unit 170. The exposure apparatus 100 is a projection exposure apparatus of, for example, a step-and-repeat system or a step-and-scan system, and exposes a circuit pattern formed on a reticle to a wafer. Such an exposure apparatus is suitably used in a lithographic process which requires precision on the order of submicron meter or quatermicron meter or smaller. Hereinbelow, this embodiment will be described taking as an example the step-and-scan system exposure apparatus (scanner).

Light emitted from the light source 110 such as an excimer laser passes through the illumination optical system 120 where the light is shaped into an exposure beam having a given shape optimum for the exposure to thereby illuminate a pattern formed on the reticle 130. The pattern on the reticle 130 includes an IC circuit pattern as an exposure target. The light (beam) outgoing from such a pattern is transmitted through the projection optical system 140 and then focused into an image near the wafer 150 surface corresponding to an imaging plane.

The reticle 130 is mounted on the reticle stage 135 movable within a plane orthogonal to an optical axis of the projection optical system 140 and in a direction of the optical axis.

The wafer 150 is mounted on the wafer stage 155 movable within a plane orthogonal to the optical axis of the projection optical system 140 and in the optical axis direction and capable of tilt correction.

The reticle stage 135 and the wafer stage 155 are relatively scanned at a speed proportional to an exposure factor to conduct the exposure of a shot region of the reticle 130. After the completion of the one-shot exposure, the wafer stage 150 is stepped to a next shot and scanning exposure is performed in a direction opposite to the previous scanning direction to thereby expose the next shot region. Repeating this operation enables the shot exposure for the entire wafer 150.

During the one-shot scanning exposure, surface position information of the wafer 150 surface is obtained by the detection system 160 for measuring a focus and a tilt. Further, a displacement from the exposure image plane is calculated based on the information. Thus, the wafer stage 155 is driven in a direction of the focus (height) and tilt to thereby effect alignment in correspondence with a shape in a height direction of the wafer 150 substantially on the exposure slit basis.

The detection system 160 adopts an optical height-measuring system. Used is a method of causing the beam to enter the wafer 150 surface with a large angle thereto (small incident angle) and detecting the displacement of an image formed by reflection light from the wafer 150 with a position detection device such as a CCD camera. The beams are allowed to enter the wafer 150 at plural measurement target points. The respective beams are guided to individual sensors to obtain information on measurements of heights at the different points, thereby calculating a tilt of the surface to be exposed.

Figure 2:
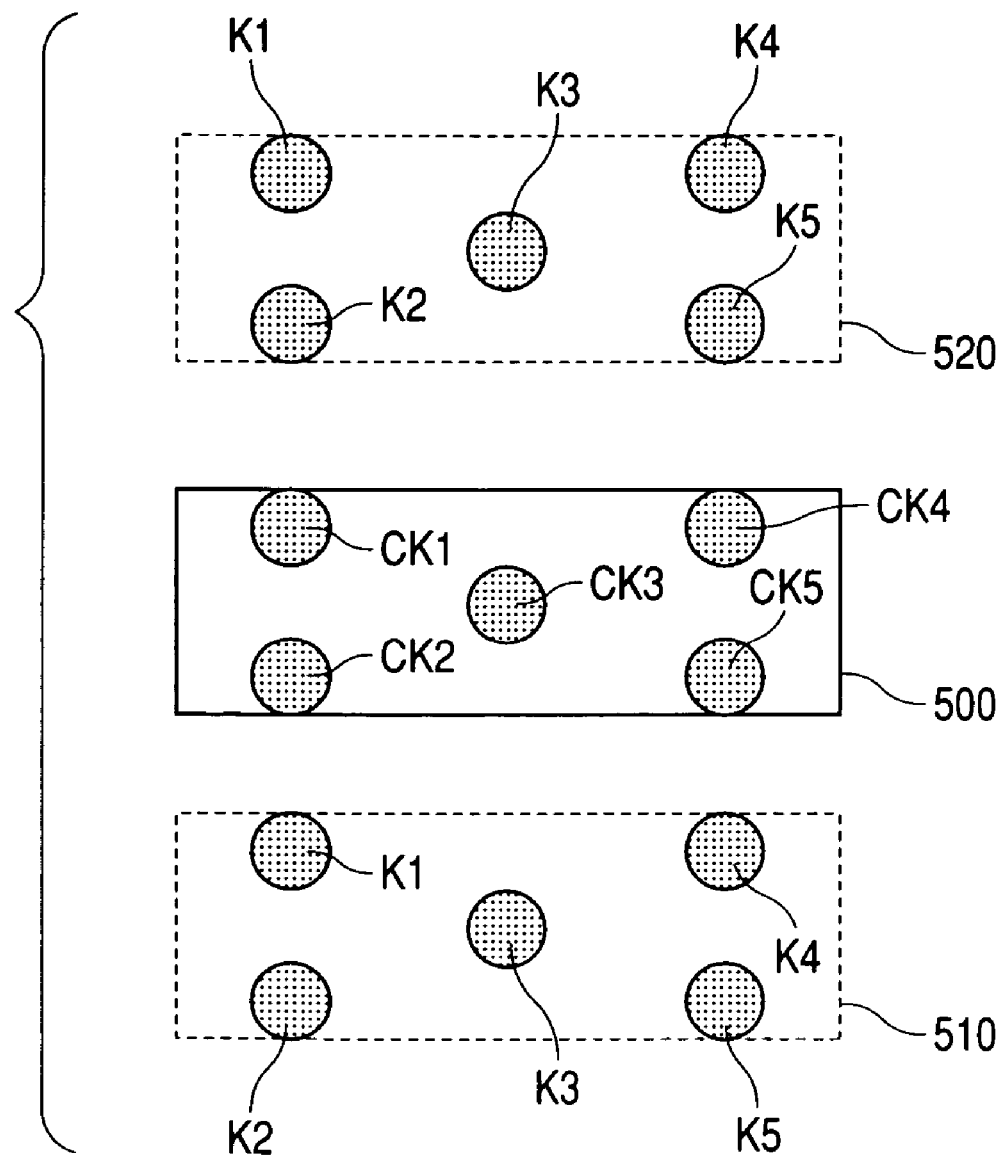
FIG. 2 is a schematic diagram showing an example of an arrangement of five measurement points relative to an exposure region.
Figure 3:
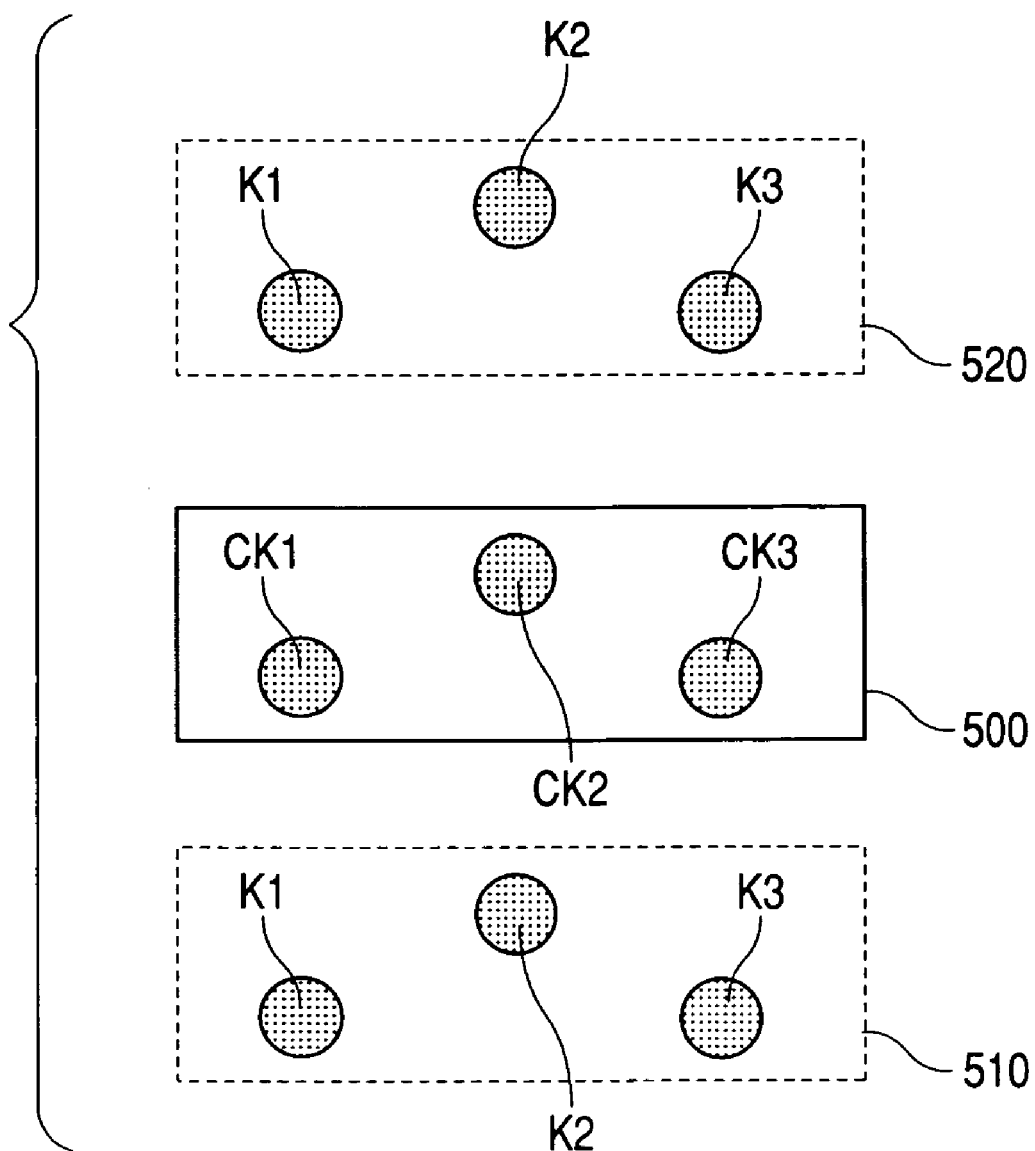
FIG. 3 is a schematic diagram showing an example of arrangement of three measurement points relative to an exposure region.

As shown in FIGS. 2 and 3, plural measurement points (K1 to K5) are arranged to form a plane in a preceding region 510 and a succeeding region 520 relative to an exposure region (i.e., exposure slit position) 500. Before the exposure slit that is being subjected to scanning exposure reaches the exposure region 500, the information on the focus and the tilt of the wafer 150, in particular, information on the tilt in the scanning direction can be obtained through the measurement simultaneously. FIGS. 2 and 3 are schematic diagrams each showing an example of arrangement of the measurement points K1 to K5 relative to the exposure region 500. FIG. 2 shows a case where the five measurement points K1 to K5 are arranged, whereas FIG. 3 shows a case where the three measurement points K1 to K3 are arranged.

The above three or five measurement points are not limited to those values but may be arbitrary number of measurement points insofar as the number is 3 or more. The three or more measurement points are preferably arranged not to be aligned. In other words, when the three points are selected from the three or more measurement points, the three points preferably form a triangle as viewed from the direction perpendicular to the wafer.

With reference to FIG. 2, the five measurement points K1 to K5 are arranged in the preceding region 510 relative to the exposure region 500 such that the projection is performed thereon. Before the exposure slit reaches the exposure region 500, the information on the focus and the tilt just before the exposure is obtained with high precision, enabling the correction of the exposure position by moving the wafer. Similarly, to cope with the scanning exposure in the opposite direction, the five measurement points K1 to K5 are arranged in the succeeding region 520 such that the projection is performed thereon as well.

Further, to confirm the focus and the tilt of the wafer 150 during the exposure, the same number of (i.e., five) confirmative measurement points CK1 to CK5 are arranged in the exposure region 500 at almost the same positions as the preceding region 510 and the succeeding region 520. That is, arranging the confirmative measurement points CK1 to CK5 enables confirmation of a correction drive amount of the wafer 150 according to the measurements obtained in the preceding region 510 and succeeding region 520 relative to the exposure region 500.

In this embodiment, the rectangular exposure region is exemplified. However, the present invention is also applicable to an arc-shaped slit. In such a case, the three measurement points are preferably arranged in an arc shape. For example, in the case of arranging the five measurement points, the five points may be arranged suitably for the control of circumscribed rectangle of the arc-shaped exposure region.

This arrangement is an improvement on a method of arranging the measurement points in line in a non-scanning direction, measuring the focus chronologically, and obtaining the tilt information in the scanning direction, with which chronological errors are caused to hinder the measurement with high precision.

Figure 4:
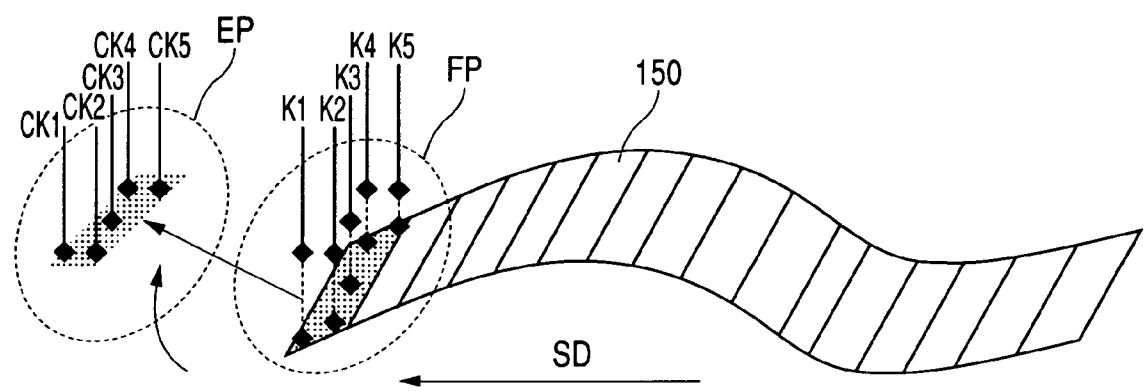
FIG. 4 is a schematic perspective view showing an exposure region and measurement positions of a focus and a tilt of a wafer.
Figure 5:
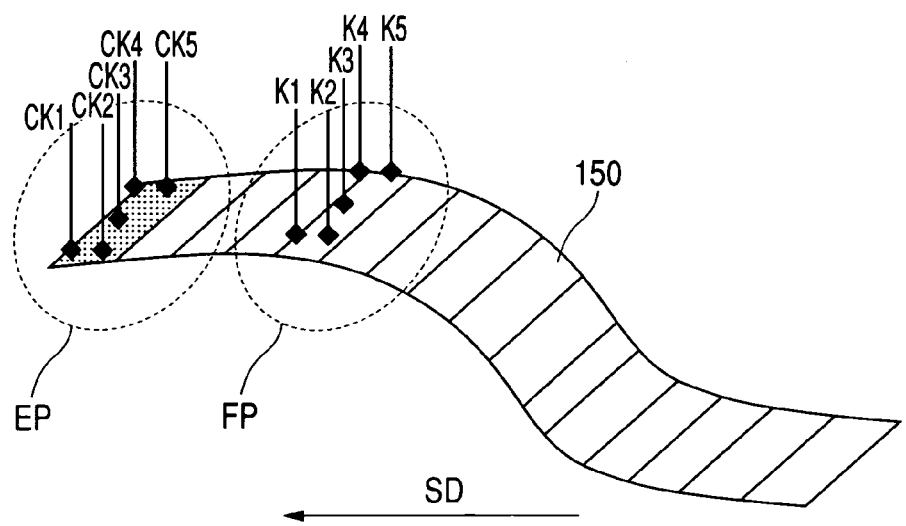
FIG. 5 is a schematic perspective view showing a state in which the wafer is moved to an exposure position based on information on the focus and the tilt of the wafer measured at the measurement positions.

Here, the surface position correction through the measurement of the focus and the tilt during the scanning exposure is outlined. As shown in FIG. 4, the measurement is performed on the focus of the surface position of the wafer 150, a tilt (referred to as "tilt X") in a longitudinal direction of the exposure slit region (direction perpendicular to a scanning direction SD) and in addition, a tilt (referred to as "tilt Y") in a transverse direction of the exposure slit (the scanning direction SD) at a measurement position FP including the plural measurement points arranged to form a plane ahead of the exposure slit, before the wafer 150 having an uneven surface shape in the scanning direction SD reaches an exposure position EP. Based on the information on the measurements, the control unit 170 drives the wafer stage 155 and corrects the surface position of the wafer 150 to the exposure position EP by moving the wafer as shown in FIG. 5. With reference to FIG. 5, by the time when the region measured prior to the exposure reaches the exposure slit, the correction is completed. The exposure is conducted at the exposure slit. Note that the control unit 170 is communicable with the detection system 160. The correction drive amount of the wafer 150 determined on the basis of measurements of the focus and the tilt at the measurement points K1 to K5 in the measurement position FP is compared with the measurements of the focus and the tilt at the confirmative measurement points CK1 to CK5 in the exposure position EP for the confirmation. The control unit 170, if there is a difference between the measurements of the focus and the tilt at the confirmative measurement points CK1 to CK5 in the exposure position EP and the correction drive amount, feeds back the difference to a next drive amount as a correction value. FIG. 4 is a schematic perspective view showing the exposure position EP and the measurement position FP for measuring the focus and the tilt, on the wafer 150. FIG. 5 is a schematic perspective view showing a state where the wafer 150 is moved to the exposure position EP based on the information on the focus and the tilt of the wafer 150 obtained at the measurement position FP.

Further, the confirmative measurement points CK1 to CK5 at the exposure position EP are arranged for obtaining the information on the focus and the tilt of the wafer 150 at almost the same position as the measurement position FP preceding the exposure position EP. Accordingly, it is possible to confirm the correction drive amount of the wafer 150 free of the influence of the locally developed surface unevennesses of the wafer 150.

Figure 6:
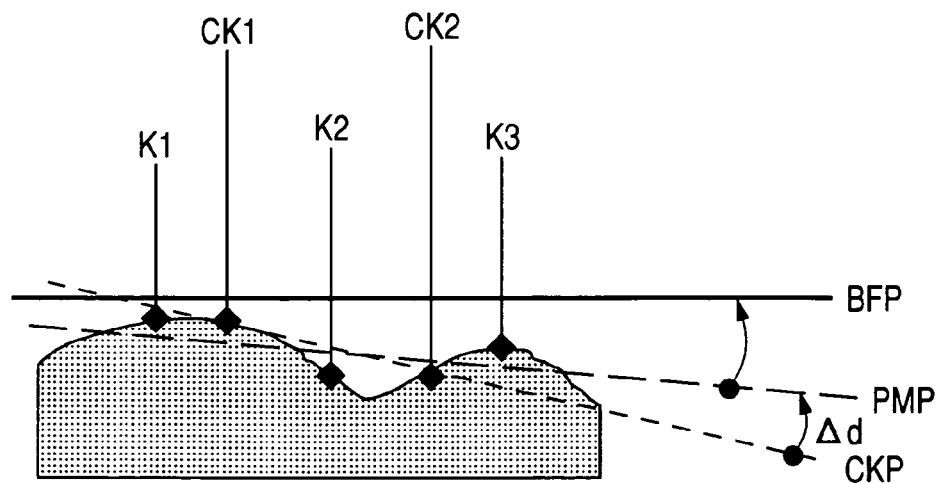
FIG. 6 is a schematic sectional view showing the wafer in a non-scanning direction in the case where measurement points of the measurement positions do not match confirmative measurement points of the exposure position.

Here, a description is made of an influence of the locally developed surface unevennesses of the wafer 150 in such a case that the arrangement of the measurement points for measuring the surface position of the wafer 150 differs between the measurement position FP and the exposure position EP. FIG. 6 is a schematic sectional diagram of the wafer 150 in the non-scanning direction in the case where the arrangement of the measurement points K1 to K3 in the measurement position FP is different from that of the confirmative measurement points CK1 and CK2 in the exposure position EP.

With reference to FIG. 6, the wafer 150 surface has the locally developed unevennesses. Then, the measurement points K1 to K3 in the measurement position FP do not match the confirmative measurement points CK1 and CK2 in the exposure position EP. In other words, the focus and the tilt of the wafer 150 are measured in the measurement position FP and the exposure position EP at different points. As a result, an error Δd is caused between a previous measurement plane PMP defined from the measurements at the measurement points K1 to K3 and an exposure position plane CKP defined from the measurements at the confirmative measurement points CK1 and CK2.

The confirmative measurement points CK1 and CK2 in the exposure position EP are arranged for confirming the correction amount calculated from the measurements at the measurement points K1 to K3 in the measurement position FP. Thus, it is important to yield an exact correction amount of the wafer 150. This is because in the exposure position EP, the focus and the tilt of the wafer 150 are measured at the confirmative measurement points CK1 and CK2 different from the measurement points K1 to K3 in the measurement position FP, so that the error Ad is added in the result by the locally developed unevennesses of the wafer 150 at the exposure position EP. If the error Δd is caused in the measurements of the focus and the tilt at the confirmative measurement points CK1 and CK2, the correction value including the error Δd is added to the next correction drive amount. Therefore, the wafer 150 cannot be aligned with the best imaging plane BFP. In this embodiment, as shown in FIGS. 2 and 3, the confirmative measurement points CK1 to CK5 within the exposure region 500 are arranged at almost the same positions as the measurement points K1 to K5 in the preceding region 510 and the succeeding region 520 relative to the exposure region 500, enabling the correction of the surface position of the wafer 150 by moving the wafer (and confirmation of the correction drive amount) with high precision.

Figure 7:
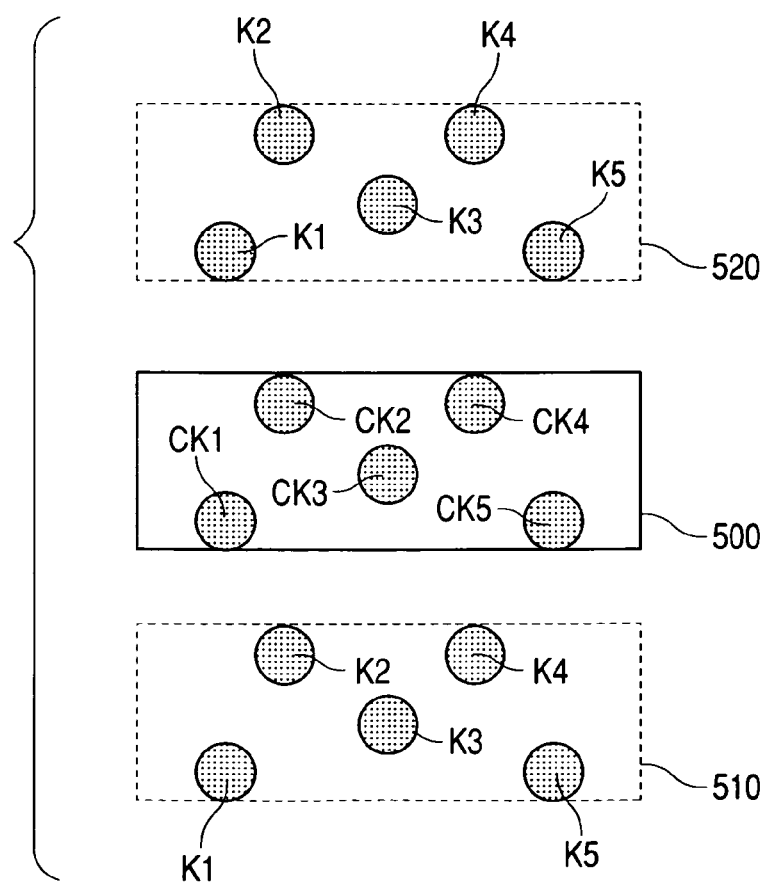
FIG. 7 is a schematic diagram showing an example of arrangement of measurement points relative to the exposure region.

In particular, as shown in FIG. 7, the arrangement is preferably performed such that, if the surface of the wafer 150 is too rough (uneven), the distance between the measurement point K2 and the measurement point K4 differs from that between the measurement point K1, and the measurement point K3 and the measurement point K5. With this arrangement, even though the measurements of the focus and the tilt of the wafer 150 at the measurement points K1 to K5 somewhat fail owing to the uneven surface of the wafer 150, the rest of the measurement points K1 to K5 are arranged to form a plane, enabling the measurement of the tilt in the scanning direction with high precision. FIG. 7 is a schematic diagram showing an example of the arrangement of the measurement points K1 to K5 relative to the exposure region 500.

Also, the plural slit-shaped beams are projected to the measurement points where the focus and the tilt of the wafer 150 are measured and received by a position detection device such as a CCD, by which the measurements can be obtained and controlled for each slit. As a result, the deficit of the measurement points around the wafer 150 can be minimized and the measurement precision around the wafer 150 can be enhanced.

Figure 8:
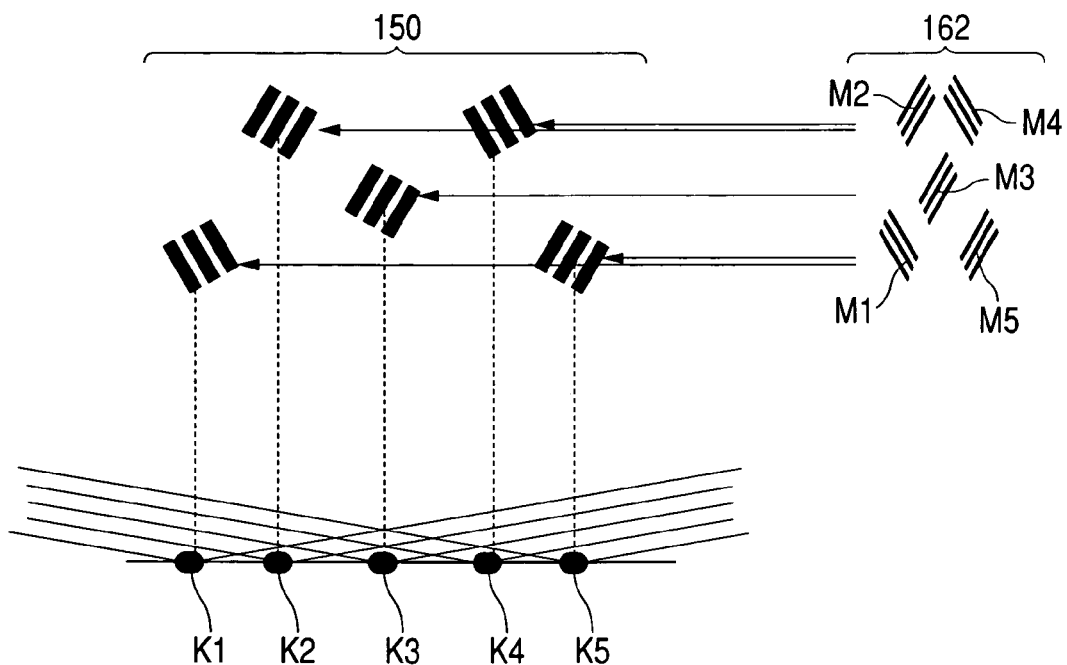
FIG. 8 is an optical schematic diagram showing a focus and tilt measuring system in the exposure apparatus of FIG. 1.

FIG. 8 is an enlarged view of a region A of FIG. 1. In addition, FIG. 8 is an optical schematic diagram showing a measuring system for the focus and the tilt in the exposure apparatus 100. Note that FIG. 8 merely shows a state where the five measurement points K1 to K5 are arranged in the measurement region for the focus and the tilt (e.g., in the preceding region 510) for convenience of explanation. In particular, in this embodiment, shown in FIG. 8 are shapes of marks M1 to M5 that are projected in such a way that the distance between the measurement point K2 and the measurement point K4 differs from the distance between the measurement point K1, and the measurement point K3 and the measurement point K5.

The focus and tilt measuring optical system is arranged such that plural light beams are incident from a direction substantially orthogonal to the scanning direction. The marks M1 to M5 to be projected to the measurement points K1 to K5 are each projected after being rotated by a predetermined amount in a cross section of the optical axis of the focus and tilt measuring optical system. As a result, the measurement slits are obliquely formed on the wafer 150 and in addition, the slits have pitch directions oriented toward the center measurement point. This makes it possible to minimize the deficit of the measurement points K1 to K5 around the wafer 150 and to improve the measurement precision around the wafer 150.

Figure 9:
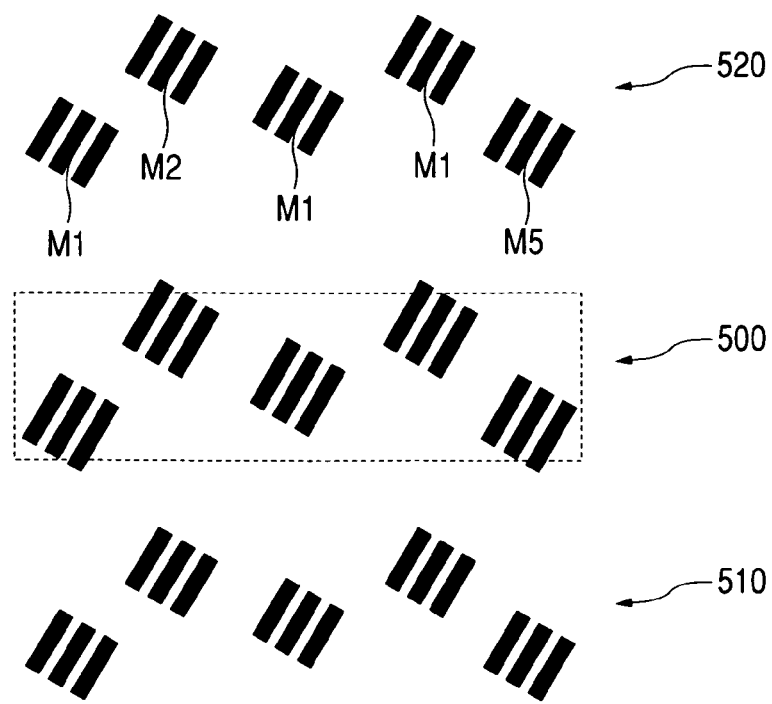
FIG. 9 is a schematic plan view showing a wafer in the case where slit-shaped marks to be projected to the measurement positions and the confirmative measurement positions are aligned in the same direction.
Figure 10:
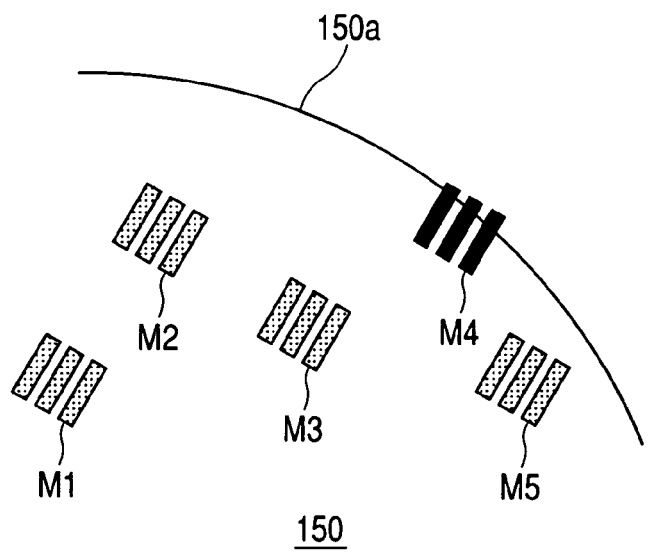
FIG. 10 is a schematic diagram showing deficit of the measurement points in the case where the slit-shaped marks to be projected to the wafer are aligned in the same direction.

As shown in FIG. 9, if the marks M1 to M5 to be projected to the measurement points K1 to K5 of the wafer 150 and the confirmative measurement points CK1 to CK5 thereof are oriented toward the same direction, as shown in FIG. 10, the deficit condition of the measurement points may vary on the wafer 150 since the wafer 150 has a circular shape. With reference to FIG. 10, all the three slits of the mark M4 are on an edge 150a of the wafer 150 at a time. As a result, the mark M4 is of no use in measuring the focus and the tilt of the wafer 150. FIG. 9 is a schematic plan view showing the wafer 150 in the case where the marks M1 to M5 to be projected to the measurement points K1 to K5 of the wafer 150 and the confirmative measurement points CK1 to CK5 thereof are oriented toward the same direction. FIG. 10 is a schematic diagram showing a deficit of the measurement points in the case where the slit-shaped marks M1 to M5 to be projected to the wafer 150 are oriented toward the same direction.

Figure 11:
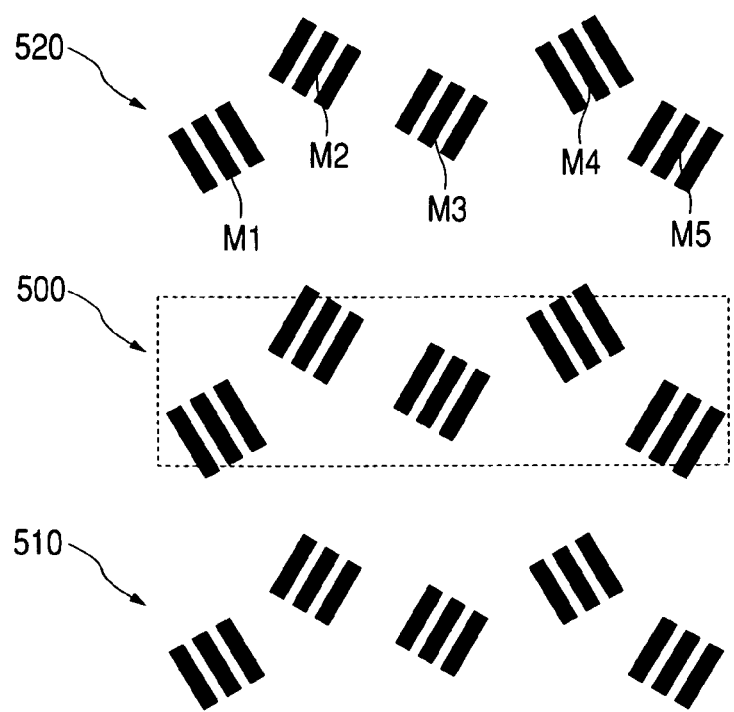
FIG. 11 is a schematic plan view showing a wafer in the case where arrangement is conducted such that the slit-shaped marks to be projected to the measurement points and the confirmative measurement points are obliquely formed and the slits have pitch directions oriented toward a center measurement point.
Figure 12:
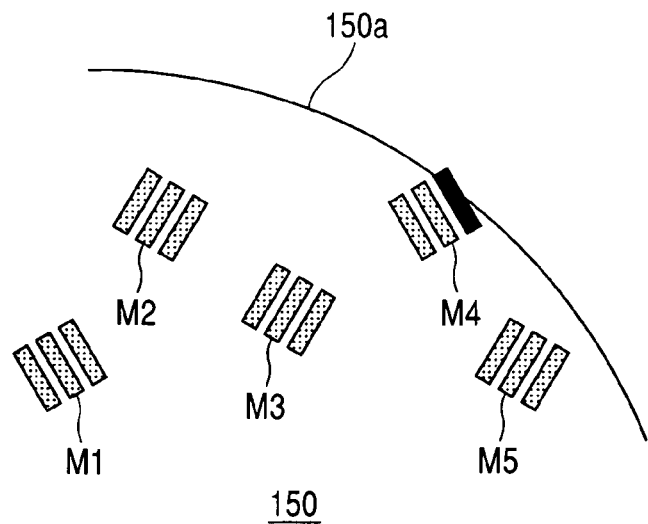
FIG. 12 is a schematic diagram showing deficit of the measurement points in the case where arrangement is conducted such that the slit-shaped marks to be projected to the measurement points and the confirmative measurement points are obliquely formed and the slits have pitch directions oriented toward the center measurement point.

On the other hand, as shown in FIG. 11, the arrangement is conducted such that the slit-shaped marks M1 to M5 to be projected to the measurement points K1 to K5 of the wafer 150 and the confirmative measurement points CK1 to CK5 thereof are obliquely formed on the wafer 150 and in addition, the slits have pitch directions oriented toward the center measurement point. With such an arrangement, as shown in FIG. 12, the outermost slit of the mark M4 is solely on the edge 150a of the wafer 150 and is thus of no use in measuring the focus and the tilt of the wafer 150. As a result, the rest of the slits (two slits) of the mark M4 can be used to measure the focus and the tilt of the wafer 150. FIG. 11 is a schematic plan view showing the wafer 150 in the case where the slit-shaped marks M1 to M5 to be projected to the measurement points K1 to K5 of the wafer 150 and the confirmative measurement points CK1 to CK5 thereof are obliquely formed on the wafer 150 and in addition, the slits have pitch directions oriented toward the center measurement point. FIG. 12 is a schematic diagram showing a deficit condition of the measurement points in the case where the slit-shaped marks M1 to M5 to be projected to the measurement points K1 to K5 and the confirmative measurement points CK1 to CK5 are obliquely formed on the wafer 150 and in addition, the slits have pitch directions oriented toward the center measurement point.

Figure 13A:
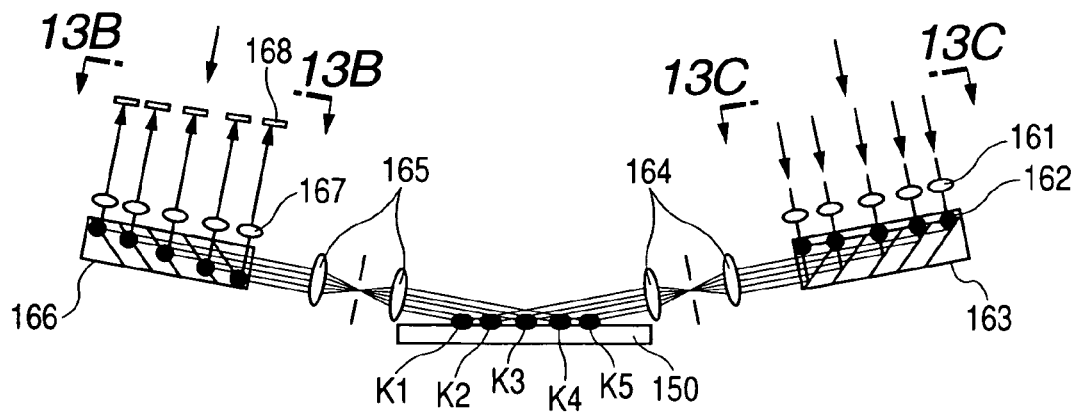
FIGS. 13A, 13B, and 13C show schematic arrangement of a measuring optical system for attaining the arrangement of the measurement points of FIG. 8.

FIG. 13A schematically shows an arrangement of the measuring optical system for attaining the arrangement of the measurement points shown in FIG. 8. Five illumination lenses 161 transmit the light supplied from a light source (not shown) therethrough to illuminate the focus measuring slit-shaped marks formed on a focus measuring projection pattern mask 162. The light source is desirably a halogen lamp or an LED with a somewhat wide wavelength range so as not to expose a photosensitive resist on the wafer 150 and so as to suppress an influence of resist thin-film interference.

Figure 13B:
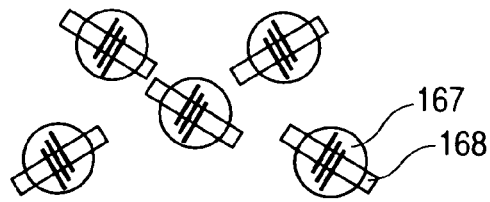
Figure 13C:
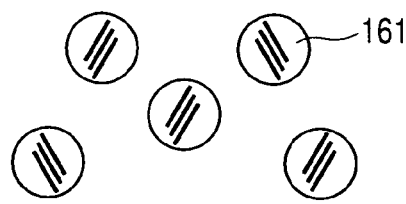

As shown in FIG. 13C, the focus measuring projection pattern mask 162 has slit-shaped marks whose number corresponding to the number of the plural measurement points. The beams obtained by illuminating the plural measurement marks undergo optical-path synthesis with an optical-path combining prism 163. Thus, the combined beam is projected obliquely on the wafer 150 by a focus mark projection optical system 164.

The beam reflected on the wafer 150 surface forms an intermediate imaging point in an optical-path dividing prism 166 using a focus light-receiving optical system 165. After the beam undergoes optical-path division for each measurement point through the optical-path dividing prism 166. After that, the divided beams are guided to position detection devices 168 for each measurement point by an enlargement detecting optical system 167 arranged for each measurement point with intent to improve a measurement resolving power. In this embodiment, used as the position detection device 168 is a one-dimensional CCD with the measurement direction set to the direction in which the devices are arranged.

In the perspective view of FIG. 13B, the relationship among the measuring marks, the position detection devices 168, and the enlargement detection optical system 167 is shown as viewed from the position detection device 168 in the optical axis direction. The position detection devices 168 for each measurement point are arranged in a direction orthogonal to the slit-shaped marks.

As the position detection device 168, the one-dimensional CCD is adopted in this embodiment but a two-dimensional CCD may be disposed. Alternatively, a reference slit plate may be formed on an imaging plane of a light-receiving device to detect, by scanning with the beam before the reference slit plate, an amount of light transmitted through the reference slit plate.

The description has been made based on a structural example in which the five measurement points are arranged in each surface position measurement region. However, the same can apply to the arrangement of the three measurement points for each measurement region.

According to the exposure apparatus and the exposure method as set forth, the wafer surface to be exposed can be aligned with the best imaging plane with respect to a focal depth to be reduced, making it possible to attain the high resolution.

Figure 14:
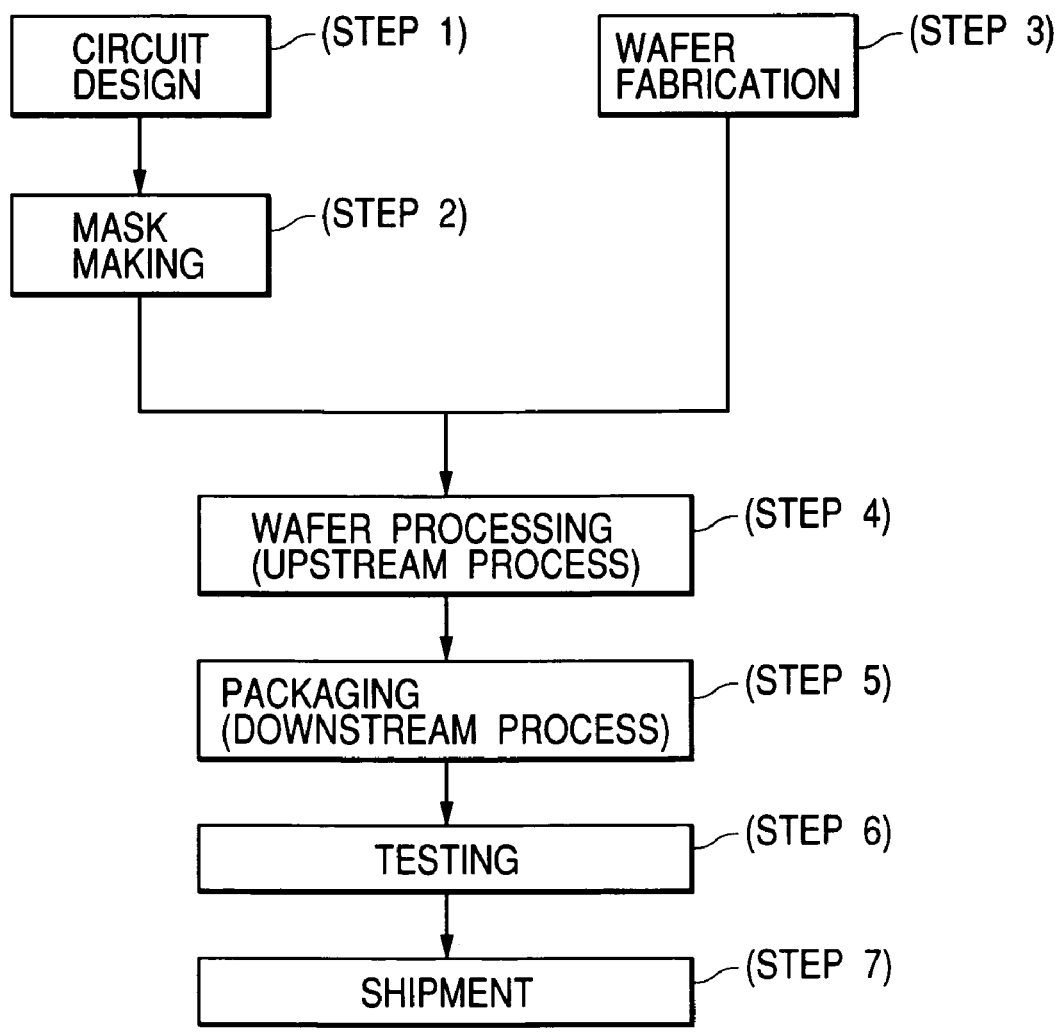
FIG. 14 is a flowchart illustrating how to manufacture a device (semiconductor chip such as IC or LSI, an LCD, a CCD, etc.)

Next, with reference to FIGS. 14 and 15, an embodiment of a device manufacturing method using the aforementioned exposure apparatus 100 will be described. FIG. 14 is a flowchart for illustrating how to manufacture the device (e.g., semiconductor chip such as IC or LSI, an LCD, or a CCD). Here, the description is given to an example of a manufacturing process for the semiconductor chip. In Step 1 (circuit design), the device is designed. In Step 2 (mask making), a mask having the designed circuit pattern formed thereon is prepared. In Step 3 (wafer fabrication), a wafer is formed of silicon or other such materials. In Step 4 (wafer processing) called an upstream process, an actual circuit is formed on the wafer by a lithographic technique using the mask and the wafer. In Step 5 (packaging) called a downstream process, a semiconductor chip is obtained from the wafer produced in Step 4. Step 5 includes an assembly step (dicing and bonding), a packaging step (chip encapsulation), or other such steps. In Step 6 (testing), tests such as an operation confirming test and a durability test are performed on the semiconductor device prepared in Step 5. Through those steps, the semiconductor device is completed, followed by shipment (in Step 7).

Figure 15:
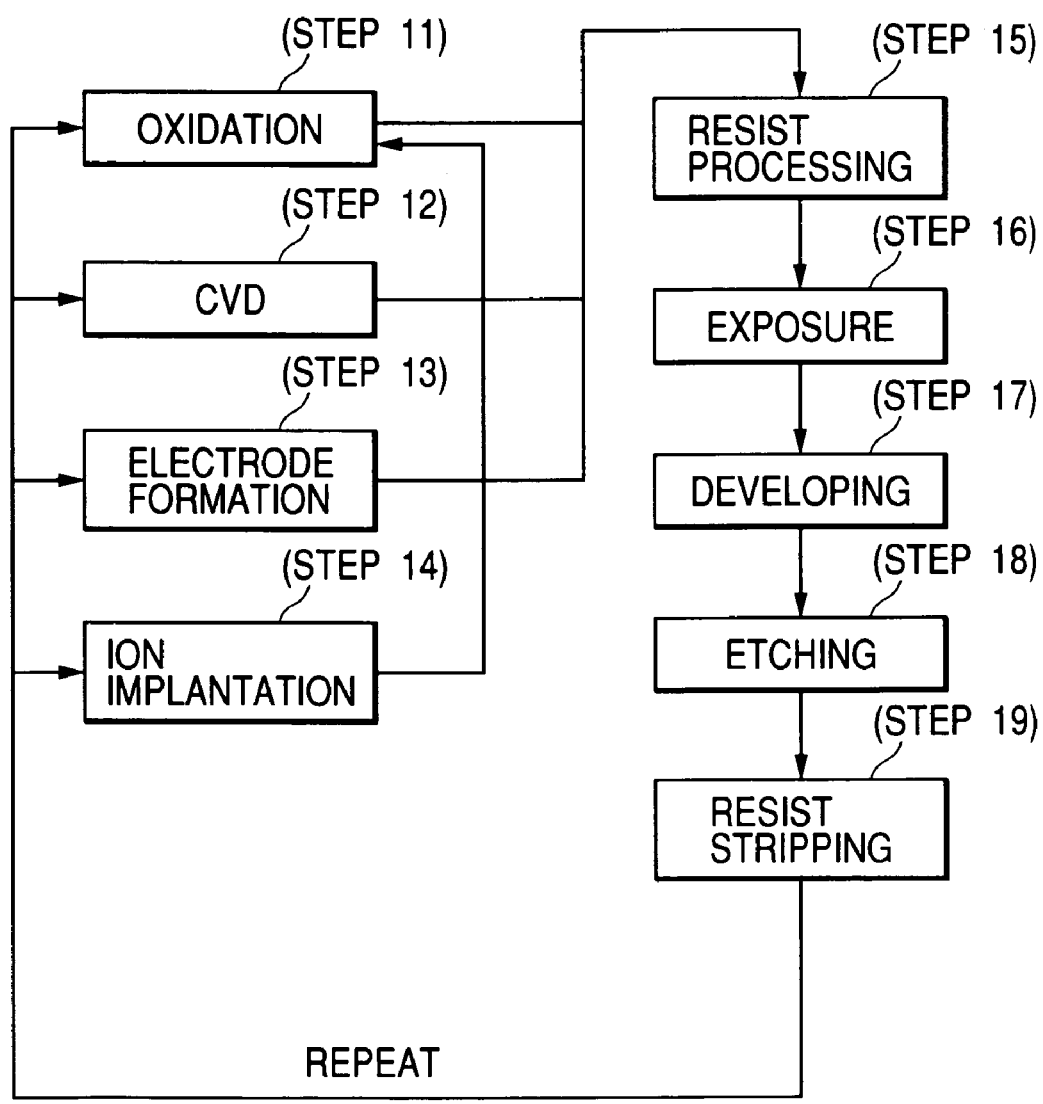
FIG. 15 is a flowchart showing a wafer process in Step 4 of FIG. 14 in detail.

FIG. 15 is a flowchart showing the wafer process in Step 4 of FIG. 14 in detail. In Step 11 (oxidation), the wafer surface is oxidized. In step 12 (CVD), an insulating film is formed on the wafer surface. In Step 13 (electrode formation), the electrode is formed through deposition etc., on the wafer. In Step 14 (ion implantation), ions are implanted into the wafer. In Step 15 (resist processing), a photosensitive agent is applied to the wafer. In Step 16 (exposure), the circuit pattern of the mask is exposed to the wafer by the exposure apparatus 100. In Step 17 (developing), the exposed wafer is developed. In Step 18 (etching), portions other than a developed resist image are etched away. In Step 19 (resist stripping), the unnecessary resist after the etching is removed. By repeating those steps, the circuit patterns are multiply formed on the wafer. According to the device manufacturing method of this embodiment, the device with a higher grade than the related arts can be manufactured. As set forth, the device manufacturing method using the exposure apparatus 100, and the resultant device are provided as another aspect of the present invention.

The entire disclosure of Japanese Patent Application Laid-Open No. 2003-070196 filed on Mar. 14, 2003 including claims, specification, drawings and abstract are incorporated herein by reference in its entirety.

As many apparently widely different embodiments of the present invention can be made without departing from the spirit and scope thereof, it is to be understood that the invention is not limited to the specific embodiments thereof except as defined in the claims.

What is claimed is:

1. An exposure apparatus for projecting and exposing a pattern formed on a reticle to an object to be exposed using a projection optical system while relatively scanning the reticle and the object to be exposed, comprising;

detecting means for measuring a position of the object to be exposed at a plurality of first measurement positions that meet a predetermined relative positional relationship in an exposure region of the object to be exposed to which the pattern is exposed and for measuring a position of the object to be exposed at a plurality of second measurement positions that meet the predetermined relative positional relationship in a region outside the exposure region; and control means for controlling at least one of a position, a height, and a tilt of the object to be exposed based on information on the position of the object to be exposed which is measured by the detecting means, wherein the plurality of first measurement positions are not arranged in a straight line, and the plurality of first measurement positions include three or more measurement positions.

2. An exposure apparatus according to claim 1, wherein the three measurement positions among the plurality of first measurement positions form a triangle.

3. An exposure apparatus according to claim 1, wherein the plurality of second measurement positions are not arranged in a straight line.

4. An exposure apparatus according to claim 1, wherein the second measurement positions include the three or more measurement positions.

5. An exposure apparatus according to claim 1, wherein the three measurement positions among the plurality of second measurement positions form a triangle.

6. An exposure apparatus according to claim 1, wherein the object to be exposed is scanned and exposed in the exposure region having a slit shape.

7. An exposure apparatus according to claim 6, wherein the second measurement position is shifted relative to the exposure region having the slit shape in the scanning direction.

8. An exposure apparatus according to claim 7, wherein:
the detecting means measures a position of the object to be exposed at a plurality of third measurement positions that meet the predetermined relative positional relationship in the regions outside the exposure region; and
the direction in which the second measurement position is shifted relative to the exposure region having the slit shape is opposite to a direction in which the third measurement position is shifted to the exposure region having the slit shape.

9. An exposure apparatus according to claim 1, further comprising a projection optical system for projecting the pattern to the object to be exposed, wherein the detecting means detects a position of the object to be exposed in a direction parallel to an optical axis of the projection optical system at the first measurement position and the second measurement position.

10. An exposure method of projecting and exposing a pattern formed on a reticle to an object to be exposed using a projection optical system while relatively scanning the reticle and the object to be exposed, comprising the steps of:
measuring a plurality of measurement positions in an exposure region outside a region of the object to be exposed to which the pattern is exposed;
driving the object to be exposed and adjusting at least one of a height and a tilt thereof to align a position of the object to be exposed with an optimum exposure position for the pattern based on information on the plurality of measurement positions obtained in the measuring step;
measuring the same positions as the plurality of positions, in the exposure region of the object to be exposed to which the pattern is exposed and confirming whether or not the object to be exposed is in the optimum exposure position;
calculating a difference between the optimum exposure position and a position of the object to be exposed in a case where the confirming step reveals that the object to be exposed is not in the optimum exposure position; and
driving the object to be exposed while adding the difference calculated in the calculating step to at least one of the height and the tilt of the object to be exposed in the driving step,
wherein the plurality of measurement positions are not arranged in a straight line, and the plurality of measurement positions include three or more measurement positions.

11. An exposure apparatus for projecting and exposing a pattern formed on a reticle to an object to be exposed using a projection optical system while relatively scanning the reticle and the object to be exposed, comprising;
detecting means for measuring a plurality of measurement positions in a region outside an exposure region of the object to be exposed to which the pattern is exposed and measuring the same positions as the plurality of measurement positions of the exposure region of the object to be exposed to which the pattern is exposed; and
control means for controlling at least one of a height and a tilt of the object to be exposed to align a position of the object to be exposed with an optimum exposure position of the pattern based on information on the position of the object to be exposed which is measured by the detecting means,
wherein the plurality of measurement positions are not arranged in a straight line, and the plurality of measurement positions include three or more measurement positions.

12. An exposure apparatus according to claim 11, wherein the detecting means measures the plurality of positions to form a plane on the object to be exposed.

13. An exposure apparatus according to claim 11, wherein the detecting means measures at least three positions of the regions outside the region of the object to be exposed to which the pattern is exposed and the region to which the pattern is exposed.

14. An exposure apparatus according to claim 11, wherein the detecting means measures five positions of the regions outside the region of the object to be exposed to which the pattern is exposed and the region to which the pattern is exposed.

15. An exposure apparatus according to claim 11, wherein the detecting means performs measurement in a scanning direction of the object to be exposed to measure the plurality of positions arranged at different intervals in a non-scanning direction.

16. An exposure apparatus according to claim 11, wherein the detecting means performs measurement on a plurality of positions of the regions outside the region of the object to be exposed to which the pattern is exposed and the region to which the pattern is exposed, by using a slit-shaped beam.

17. An exposure apparatus according to claim 16, wherein the slit-shaped beam aligns a pitch direction thereof to a substantially center position among the plurality of positions.

18. A device manufacturing method comprising the steps of:
performing projection and exposure on an object to be exposed using the exposure apparatus according to claim 11; and
performing a predetermined process on the object to be processes after the projection and exposure.

19. An exposure apparatus for projecting and exposing a pattern formed on a reticle to an object to be exposed using a projection optical system while relatively scanning the reticle and the object to be exposed, comprising:
a focus detection system for, in at least one of a preceding region and a succeeding region of an exposure region of the object to be exposed, substantially simultaneously illuminating a plurality of positions which are arranged in a direction perpendicular to a scanning direction on the object to be exposed with light oblique with respect to the object to be exposed, and detecting the light from the object to be exposed with a sensor to determine the plurality of positions of the object to be exposed in an optical axis direction of the projection optical system; and
control means for controlling at least one of a position of the object to be exposed in the optical axis direction and a tilt thereof based on information on the plurality of positions of the object to be exposed in the optical axis direction, which are determined by the focus detection system,
wherein the plurality of positions are arranged to form a plane on the object to be exposed and the plurality of positions of the exposure region match the plurality of positions of at least one of the preceding region and the succeeding region of the exposure region of the object to be exposed.

20. An exposure method of projecting and exposing a circuit pattern formed on a reticle to an object to be exposed using a projection optical system while relatively scanning the reticle and the object to be exposed, comprising the steps of:

measuring a plurality of positions in a region outside a region of the object to be exposed to which the pattern is exposed;

driving the object to be exposed and adjusting at least one of a height and a tilt thereof to align a position of the object to be exposed with an optimum exposue position for the pattern based on information on the positions obtained in the measuring step;

measuring the same positions as the plurality of positions, in he region of the object to be exposed to which the pattern is exposed and confirming whether or not the object to be exposed is in the optimum exposure position;

calculating a difference between the oiptimum exposure position and the position of the object to be exposed in a case where the confirming step reveals that the object to be exposed is not in the optimum exposure position; and driving the object to be exposed while adding the difference calculated in the calculating step to at least one of the height and the tilt of the object to be exposed in the driving step, wherein the plurality of first measurement positions are not arranged in a straight line, and the first measurement positions include three or more measurement positions.

21. A device manufacturing method comprising the steps of:

performing projection and exposure on an object to be exposed using the exposure apparatus according to claim 1; and performing a predetermined process on the object to be processes after the projection and exposure.

* * * * *

UNITED STATES PATENT AND TRADEMARK OFFICE
CERTIFICATE OF CORRECTION

PATENT NO. : 7,050,151 B2  Page 1 of 1
APPLICATION NO. : 10/798817
DATED : May 23, 2006
INVENTOR(S) : Seiya Miura It is certified that error appears in the above-identified patent and that said Letters Patent is hereby corrected as shown below:

Column 11, claim 10, lines 27-28, "an exposure region" should be changed to --a region --;

Column 11, claim 10, line 28, "a exposure region" should be changed to --an exposure region--;

Column 13, claim 20, line 15, before "positions" insert --plurality of measurement--;

Column 13, claim 20, line 18, "in he", should be changed to --in the exposure--;

Column 13, claim 20, line 22, "oiptimum" should be changed to --optimum--; and

Column 14, claim 20, line 9, "first" should be changed to --plurality of--.

Signed and Sealed this

First Day of May, 2007

JON W. DUDAS
*Director of the United States Patent and Trademark Office*